(12) United States Patent
Uchida et al.

(10) Patent No.: US 6,369,318 B1
(45) Date of Patent: Apr. 9, 2002

(54) RADIANT NOISE INHIBITING ASSEMBLY

(75) Inventors: Katsuyuki Uchida, Hikone; Masami Sugitani, Fukui-ken; Yukio Sakamoto, Moriyama, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/252,859

(22) Filed: Feb. 17, 1999

(30) Foreign Application Priority Data

Feb. 19, 1998 (JP) .......................................... 10-056218

(51) Int. Cl.⁷ ................................................ H01B 7/18
(52) U.S. Cl. ...................................................... 174/36
(58) Field of Search .............................. 174/36, 106 SC, 174/106 R, 102 SC, 92; 333/12, 236, 243; 336/92

(56) References Cited

U.S. PATENT DOCUMENTS

| | | | | |
|---|---|---|---|---|
| 4,146,854 A | * | 3/1979 | Ishino et al. ............... | 333/61 R |
| 4,371,742 A | * | 2/1983 | Manly .......................... | 174/36 |
| 5,053,582 A | * | 10/1991 | Terakawa et al. ............. | 174/36 |
| 5,262,591 A | * | 11/1993 | Aldissi ......................... | 174/36 |
| 5,287,074 A | * | 2/1994 | Meguro et al. ................ | 333/12 |
| 5,343,184 A | * | 8/1994 | Matsui et al. ................. | 336/92 |
| 5,373,277 A | * | 12/1994 | Naito .......................... | 336/92 |
| 5,902,957 A | * | 5/1999 | Takahashi et al. ............. | 174/36 |
| 6,143,406 A | * | 11/2000 | Uchida et al. ............... | 428/336 |

FOREIGN PATENT DOCUMENTS

| | | |
|---|---|---|
| DE | 38 01 188 | 8/1988 |
| JP | 3-211906 | 9/1991 |
| JP | 4-82814 | 7/1992 |
| JP | 4-326824 | 11/1992 |
| JP | 5-145271 | 6/1993 |
| JP | 6-2788 | 1/1994 |
| JP | 6-132692 | 5/1994 |
| JP | 7-58482 | 3/1995 |
| JP | 7-240593 | 9/1995 |
| JP | 7-297588 | 11/1995 |

* cited by examiner

*Primary Examiner*—Chau N. Nguyen
(74) *Attorney, Agent, or Firm*—Keating & Bennett, LLP

(57) ABSTRACT

A radiant noise inhibiting assembly is constructed to inhibit a radiant noise in an electric cable connected to a digital type electronic device. The electric cable is covered by a substantially cylindrical magnetic structure which is constructed to act as a magnetic shield. A substantially cylindrical electrically conductive structure functioning as an electrostatic shield is disposed on the outside of the magnetic structure. Only a first end of the electrically conductive structure is connected to a ground of the electronic device, which first end is closer to the electronic device than a second end of the electrically conductive structure, which is not grounded. In this way, a portion of the radiant noise which is not completely absorbed by the substantially cylindrical magnetic structure is absorbed by the substantially cylindrical electrically conductive structure, thereby sufficiently inhibiting the radiant noise of the electric cable. Further, a substantially cylindrical case which is constructed to function as an electrically conductive structure and provide a function of an electrostatic shield is used. Thus, attaching such a substantially cylindrical case is the same as attaching an electrically conductive structure.

20 Claims, 9 Drawing Sheets

RADIANT NOISE INHIBITING ASSEMBLY

BACKGROUND OF THE INVENTION

1. Field of the Invention

The present invention relates to a radiant noise inhibiting assembly, and more particularly, to a radiant noise inhibiting assembly constructed to inhibit a radiant noise in an electric cable which is connected to a digital type electronic device.

2. Description of the Related Art

With a digital type electronic device such as a personal computer or a word processor which is controlled by high frequency digital signals, there has long been a problem that a radiant noise will disturb a picture plane of a display monitor connected thereto. To prevent such a problem and to inhibit such radiant noise, it is often necessary to take some countermeasures in an electric cable serving as a data line and an electric cable serving as a power supply line, both connected to a digital type electronic device.

As a practically useful method for inhibiting a radiant noise in an electric cable, it has been suggested that the electric cable be inserted into and through an elongated tubular magnetic member, or alternatively, an electric cable be passed through several ring-shaped core type magnetic members. With the use of the above methods, a common mode noise will be induced in an electric cable. The magnetic member causes an inductance in the electric cable. The inductance and a frequency component of the common mode noise generate an impedance. The impedance can inhibit the above described radiant noise.

FIG. 12 is a perspective view schematically illustrating an arrangement for inhibiting a radiant noise in an electric cable, which has been disclosed in Japanese Unexamined Patent Publication No. 3-211906. As shown in FIG. 12, an electric cable 70 is inserted into and through an elongated tubular, electrically conductive member 71. Then, the electric cable 70 together with the elongated tubular electrically conductive member 71 are further inserted into and through an elongated tubular magnetic member 72. One end of the elongated tubular electrically conductive member 71 is connected to a ground of the electronic device so as to be grounded. In this way, a structure capable of inhibiting a radiant noise in the electric cable 70 may thus be formed. Therefore, by using such an arrangement shown in FIG. 12, it is possible to make use of a function of a magnetic shield provided by the elongated tubular magnetic member 72, and a function of an electrostatic shield provided by the elongated tubular electrically conductive member 71, thereby effectively inhibiting a radiant noise in the electric cable 70.

However, since a digital type electronic device is required to operate and be controlled at a higher and higher speed, the above-discussed arrangement shown in FIG. 12 has been found to be insufficient for inhibiting a radiant noise of an electric cable. Accordingly, it has recently been demanded that a more efficient structure be provided which can be used to more effectively inhibit a radiant noise of an electric cable.

SUMMARY OF THE INVENTION

To overcome the problems described above, preferred embodiments of the present invention provide an improved radiant noise inhibiting assembly which is constructed to sufficiently inhibit a radiant noise in an electric cable which is connected to a digital type electronic device.

A radiant noise inhibiting assembly according to a preferred embodiment of the present invention includes a magnetic structure arranged in a longitudinal direction of an electric cable connected to a digital type electronic device, the magnetic structure being arranged to continuously or intermittently cover an entire circumference of the electric cable along a certain range, an electrically conductive structure continuously covering the entire range where the magnetic structure covers the electric cable. In particular, only a first end of the electrically conductive structure is connected to a ground of the electronic device, the first end being closer to the electronic device than a second end of the electrically conductive structure.

In the radiant noise inhibiting assembly of preferred embodiments of the preset invention, an electric cable is covered by a substantially cylindrical magnetic structure functioning as a magnetic shield and a substantially cylindrical electrically conductive structure functioning as an electrostatic shield is disposed on the outside of the magnetic structure. With this unique arrangement, it is possible to sufficiently absorb a radiant noise by the magnetic structure functioning as a magnetic shield. A portion of radiant noise which is not completely absorbed by the substantially cylindrical magnetic structure is completely absorbed by the substantially cylindrical electrically conductive structure, thereby completely inhibiting the radiant noise in the electric cable.

Further, in the radiant noise inhibiting assembly of preferred embodiments of the present invention, only a first end of the electrically conductive structure which is constructed to function as an electrostatic shield is connected to a ground of the electronic device. The first end is closer to the electronic device than a second end of the electrically conductive structure. Thus, the second end of the electrically conductive structure is not grounded. Therefore, it is possible to completely prevent a radiant noise from transmitting through the electrically conductive structure, which provides a function of an electrostatic shield, to an electronic device connected at the front end of the electric cable. Moreover, the radiant noise inhibiting assembly of preferred embodiments of the present invention may be attached to an electric cable within a length of about 1 m from the electronic device, such that the length of the radiant noise inhibiting assembly may be adjusted in accordance with a length of the electric cable and a noise amount required to be inhibited, thereby rendering it possible to sufficiently inhibit a radiant noise in the electric cable.

Further, the radiant noise inhibiting assembly of preferred embodiments of the present invention may be such that the magnetic structure preferably has a substantially annular shape or has a substantially sheet-like shape.

Further, the radiant noise inhibiting assembly of preferred embodiments of the present invention may include a substantially cylindrical case which is constructed such that the electric cable covered by the magnetic structure passes through an internal space of the substantially cylindrical case and the electrically conductive structure is disposed in the substantially cylindrical case, such that the magnetic structure is completely covered by the electrically conductive structure.

Moreover, the radiant noise inhibiting assembly of preferred embodiments of the present invention may be such that the magnetic structure to be received into the substantially cylindrical case is preferably a sheet-like magnetic material having a predetermined flexibility, the magnetic structure is adapted to cover up the outer surface of the electric cable by being wound around the outer surface of the electric cable, or by having a two-layer structure arranged such that the electric cable is sandwiched between the two layers of the two-layer magnetic structure.

Further, the radiant noise inhibiting assembly of preferred embodiments of the present invention may be such that the magnetic structure preferably includes two substantially cylindrical flexible members each having an elongated slot extending from a first end to a second end in a longitudinal direction thereof, a first of the two substantially cylindrical members is positioned on the outside of the electric cable so as to cover the electric cable, a second of the two substantially cylindrical members is positioned on the outside of the first substantially cylindrical member so as to cover main portions thereof including its elongated slot with the electric cable located at the innermost portion thereof.

Moreover, the radiant noise inhibiting assembly of preferred embodiments of the present invention may be such that the magnetic structure may include a plurality of ring-like core members, each of which is a two-piece type ring-like core member including two half-ring core pieces, the substantially cylindrical case is a two-piece type, substantially cylindrical case including two elongated half cylindrical pieces divided in the longitudinal direction thereof. The half-ring core pieces are arranged on the two elongated half cylindrical pieces in a manner such that when the two elongated half cylindrical pieces are closed together to form the cylindrical case, each of the pairs of corresponding half-ring core pieces define one ring-like core member.

Further, the radiant noise inhibiting assembly of preferred embodiments of the present invention may be such that the electric cable is a flat cable, the magnetic structure is a two-layer sheet-like magnetic structure having a predetermined flexibility, and is positioned on both sides of the flat cable in a manner such that the flat cable is sandwiched between two layers of the two-layer sheet-like magnetic structure. The substantially cylindrical case is preferably a flat case including two half case pieces divided in the longitudinal direction thereof. When the two half case pieces are closed together, two longitudinal edge portions of the two-layer sheet-like magnetic structure covering the flat cable are firmly pressed by the two half case pieces of the flat case, thereby forming a closed magnetic circuit around the flat cable.

Moreover, the radiant noise inhibiting assembly of preferred embodiments of the present invention may be such that the flexible magnetic structure is made of a magnetic rubber obtained by mixing and kneading a desired amount of magnetic particles into a rubber.

Further, the radiant noise inhibiting assembly of preferred embodiments of the present invention may be such that the substantially cylindrical case is preferably made of a metal so that the substantially cylindrical case itself can serve as an electrically conductive structure, or the substantially cylindrical case is made of a resin, and a metal film is provided on the surface of such resin case so as to provide an electrical conductivity for the substantially cylindrical case.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Some preferred embodiments of the present invention will be described below, with various features explained in more detail.

Figure 1:
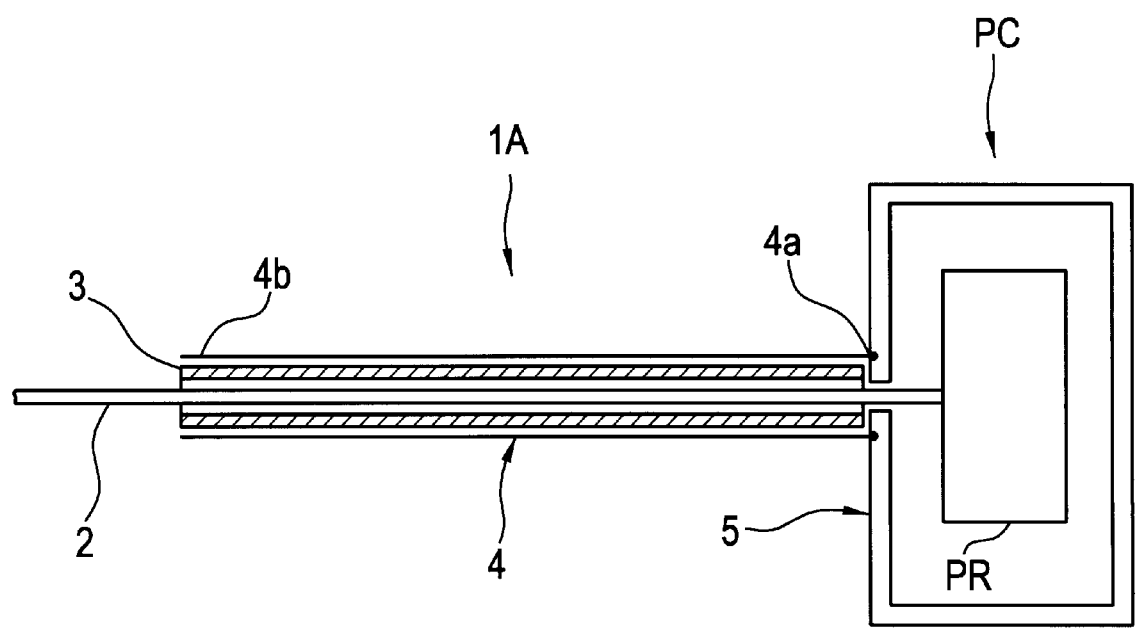
FIG. 1 is a schematically explanatory view illustrating an attachment of a radiant noise inhibiting assembly according to a preferred embodiment of the present invention.
Figure 2:
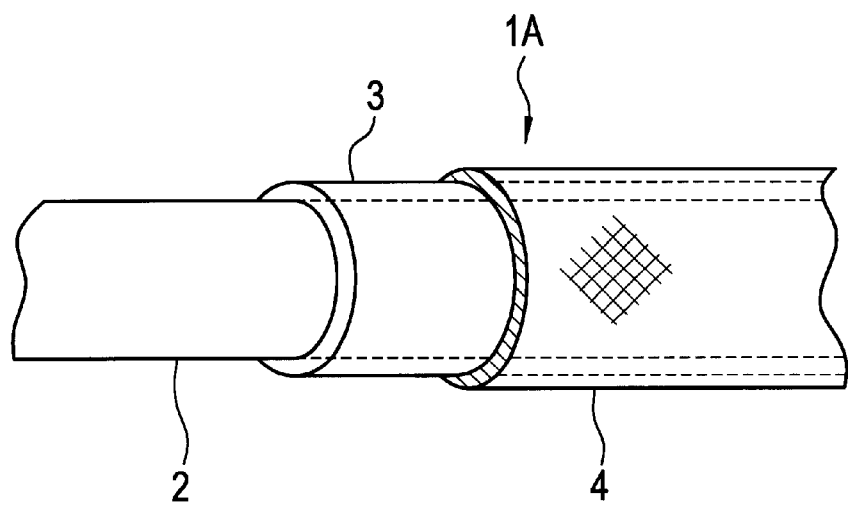
FIG. 2 is a perspective view schematically illustrating some important portions of the radiant noise inhibiting assembly according to a preferred embodiment of the present invention.

FIG. 1 is an explanatory view schematically illustrating an attachment of a radiant noise inhibiting assembly according to a preferred embodiment of the present invention. FIG. 2 is a perspective view schematically illustrating important portions of the radiant noise inhibiting assembly shown in FIG. 1.

As shown in FIGS. 1 and 2, a radiant noise inhibiting assembly 1A according to a first preferred embodiment of the present invention, includes an elongated, substantially cylindrical magnetic structure 3 covering the outer surface of an electric cable 2 along a longitudinal direction thereof and an elongated, substantially cylindrical electrically conductive structure 4 covering the entire outer surface of the elongated cylindrical magnetic structure 3. The cable 2 is connected to a digital type electronic device such as a personal computer. In the radiant noise inhibiting assembly 1A, the elongated, substantially cylindrical magnetic structure 3 is disposed at an innermost portion thereof, and the elongated, substantially cylindrical electrically conductive structure 4 is disposed on the outside of the magnetic structure 3. Further, the elongated, substantially cylindrical electrically conductive structure 4 is electrically insulated from the cable 2.

Further, the elongated cylindrical electrically conductive structure 4 is connected to ground through a first end 4a thereof, located close to an electronic device such as a personal computer. More specifically, the first end 4a is connected to an electrically conductive shield case 5 which is a ground of the electronic device. A second end 4b of the elongated cylindrical electrically conductive structure 4 is not grounded.

The electric cable 2 has an electrically insulating material such as polyvinyl chloride on its outer surface thereof. More specifically, such an electric cable 2 includes a plurality of electrically conductive wires which are mutually insulated from one another. Further, as shown in FIG. 1, within the electrically conductive shield case 5 there is provided a high frequency oscillator PR for producing a high frequency digital signal. Such a high frequency digital signal generated by the high frequency oscillator PR is supplied outwardly from the electrically conductive shield case 5 by way of the electrically conductive wires of the electric cable 2. In this manner, since the high frequency oscillator PR is completely sealed within the electrically conductive shield case 5, any radiant noise (radiation of an electro-magnetic wave) can be considered to have been caused solely by the electric cable 2. Moreover, in the present preferred embodiment, the electric cable 2 is directly connected to the high frequency oscillator PR, thereby obtaining a high radiation level, so that a function of inhibiting radiant noise may be easily investigated.

The substantially cylindrical magnetic structure 3 is preferably a tubular member formed of ferrite magnetic particles. More preferably, an amount of ferrite magnetic particles which may be used for a core-type magnetic member capable of providing a magnetic permeability of about 450 (measured frequency: 1 MHz), is comminuted so as to be formed into further smaller particles having an average diameter of about 15 $\mu$m. Then, about 90 weight percent of the magnetic particles are mixed and kneaded with a silicone rubber material, and a resulting mixture is then molded into a tubular member via extrusion. A finally obtained tubular member preferably has, for example, an inner diameter of about 8 mm, a thickness of about 1 mm and a length of about 25 cm. On the other hand, the elongated, substantially cylindrical electrically conductive structure 4 is preferably a substantially cylindrical wire-knitted tubular member having a length slightly longer than about 25 cm.

COMPARATIVE EXAMPLE 1

Comparative example 1 is almost the same as the above-described preferred embodiment except that an elongated cylindrical magnetic structure 3 and an elongated cylindrical electrically conductive structure 4 are not provided. That is, there are no structures for inhibiting a radiant noise of an electric cable provided.

COMPARATIVE EXAMPLE 2

Comparative example 2 is almost the same as the above-described preferred embodiment except that an elongated cylindrical magnetic structure 3 is not provided.

COMPARATIVE EXAMPLE 3

Comparative example 3 is almost the same as the above-described preferred embodiment except that an elongated cylindrical electrically conductive structure 4 is not provided.

COMPARATIVE EXAMPLE 4

Comparative example 4 is almost the same as the above-described preferred embodiment except that an elongated cylindrical magnetic structure 3 is positioned on the outer side and the elongated cylindrical electrically conductive structure 4 is positioned on the innermost portion of the structure. In this comparative example 4, the cylindrical electrically conductive structure 4 is positioned within the inner side of the cylindrical magnetic structure 3.

COMPARATIVE EXAMPLE 5

Comparative example 5 is almost the same as the above-described preferred embodiment except that another cylindrical wire-knitted member is inserted into the cylindrical magnetic structure 3. In this comparative example 5, the cylindrical wire-knitted member is further located on the innermost portion of the radiant noise inhibiting assembly.

The radiation levels of the electro-magnetic waves in the above-described preferred embodiment and the comparative examples 1–5 were measured, and respective radiant noise attenuation amounts thereof were also measured using as a reference the above comparative example 1 in which the radiant noise is not inhibited at all.

With the radiant noise inhibiting assembly 1A according to a first preferred embodiment of the present invention, it has been confirmed that when a radiant noise has a frequency from about 200 MHz or 300 MHz to about 700 MHz, it is possible to ensure an effect that such radiant noise may be inhibited by about 15 dB.

In contrast, with comparative example 2, although it has been confirmed that it is possible to ensure an effect of inhibiting a radiant noise by about 5 dB when a radiant noise has a frequency of 100 MHz or less, it has been found that there would be almost no effect of inhibiting a radiant noise when such noise has a frequency which is higher than 100 MHz. Similarly, with comparative example 3, it has been confirmed that a radiant noise was inhibited by about 5 dB, an inhibiting effect which is only ⅓ of that of the radiant noise inhibiting assembly achieved according to the first preferred embodiment of the present invention. Further, with comparative example 4, it was found that a radiant noise inhibiting effect was the same as that of comparative example 3.

Figure 3:
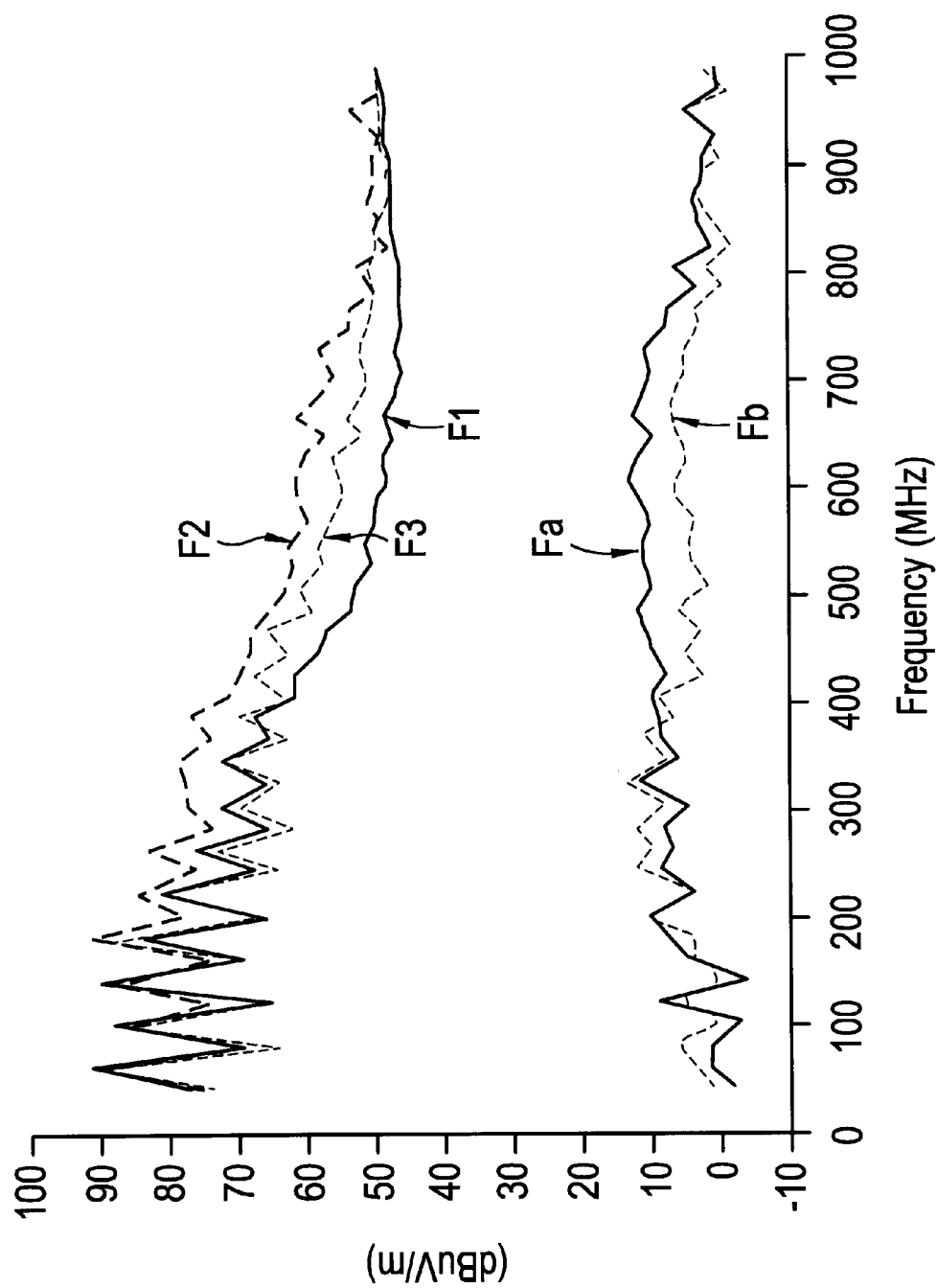
FIG. 3 is a graph showing measured results indicating radiation levels and attenuation amounts of electro-magnetic waves when using a radiant noise inhibiting assembly of a preferred embodiment and of a radiant noise inhibiting assembly of a comparative example 5.

Further, with comparative example 5, as shown in FIG. 3, if compared with the above first preferred embodiment, it was found that an effect of inhibiting a radiant noise was reduced greatly, i.e., when a radiant noise has a frequency of about 400 MHz to about 800 Mhz, such radiant noise can only be inhibited by about 5 dB to about 7 dB, an inhibiting effect that is much lower than that achieved by the radiant noise inhibiting assembly according to the first preferred embodiment.

However, in FIG. 3, a curve Fa indicates measured results representing radiant noise attenuation achieved with the use of the radiant noise inhibiting assembly according to the first preferred embodiment of the present invention, a curve Fb indicates measured results representing radiant noise attenuation obtainable with the use of the radiant noise inhibiting assembly according to comparative example 5. Referring again to FIG. 3, a curve F1 represents measured results indicating a radiation level of a radiant noise when using the radiant noise inhibiting assembly of the above first preferred embodiment, F2 represents measured results indicating a radiation level of a radiant noise when using the radiant noise inhibiting assembly of comparative example 1.

Further, a curve F3 represents measured results indicating a radiation level of a radiant noise when using the radiant noise inhibiting assembly of comparative example 5.

The following conclusion may be understood from a comparison between the above-described first preferred embodiment and comparative example 5. If a radiant noise inhibiting assembly according to the first preferred embodiment is incorporated in a device and a substantially cylindrical magnetic structure 3 functioning as a magnetism shield is positioned at an innermost portion and a substantially cylindrical electrically conductive structure 4 functioning as a electrostatic shield is positioned on the outside of the magnetic structure 3, it is possible to achieve a much greater inhibiting of a radiant noise than a radiant noise inhibiting assembly of comparative example 5 in which another cylindrical wire-knitted member is inserted within a cylindrical magnetic structure 3.

However, in order for the substantially cylindrical electrically conductive structure 4 to achieve a sufficient function as an electrostatic shield, a first end 4a of the cylindrical electrically conductive structure 4 which is connected to an electronic device should be connected to the ground of the electrically conductive shield case 5. Nevertheless, since a second end 4b of the cylindrical electrically conductive structure 4 is not grounded and is located far away from the electronic device, there is no possibility for noise to be transmitted through the substantially cylindrical, electrically conductive structure 4 to other electronic devices connected to the front end of the electric cable 2. Further, since there is only one portion serving as a ground connection, the radiant noise inhibiting assembly is easily installed at a predetermined position.

Further, when using the radiant noise inhibiting assembly of the first preferred embodiment, if the assembly has a length of about 25 cm to about 1 m and is attached to an electric cable, extending within a range which is approximately about 1 m measured from an end of an electronic device, it is easy to sufficiently inhibit a radiant noise of an electric cable. For this reason, it is not required to set a distance longer than about 1 m for installing a radiant noise inhibiting assembly. Therefore, it is not necessary to have the substantially cylindrical magnetic structure 3 made from a more flexible material. Accordingly, for forming a cylindrical magnetic structure 3, it is possible to use a material having a relatively high ratio of magnetic particles with respect to a rubber material, thereby obtaining a cylindrical magnetic structure having a high magnetic permeability and a sufficient function as a magnetic shield.

Although it has been described in the above preferred embodiment 1 that a substantially cylindrical electrically conductive structure may be a substantially cylindrical wire-knitted member, it is also possible to use one of any other forms of a substantially cylindrical electrically conductive structure, provided that such a substantially cylindrical electrically conductive structure is capable of covering almost all the outer surface of the substantially cylindrical magnetic structure. For instance, it is possible that the substantially cylindrical magnetic structure may be wound by a metal foil so that the outer surface thereof can be covered up by the metal foil. Moreover, it is also possible that a metal cylindrical structure may be formed in advance, so that the magnetic structure may be embedded into an already-formed, substantially cylindrical metal structure.

Radiant noise inhibiting assemblies according to other preferred embodiments of the present invention will be described in detail below.

A radiant noise inhibiting assembly according to a second preferred embodiment of the present invention has almost the same structure as the assembly according to the above-described first preferred embodiment, except that the radiant noise inhibiting assembly of the second preferred embodiment is constructed such that the substantially cylindrical magnetic structure 3 and the substantially cylindrical electrically conductive structure 4 each has a length of about 50 cm which is about two times the length of each of the substantially cylindrical magnetic structure 3 and the substantially cylindrical electrically conductive structure 4 of the above-described first preferred embodiment. To avoid repeated explanation, only different portions will be described in detail below, omitting explanation of the similar portions.

When using the radiant noise inhibiting assembly according to the second preferred embodiment of the present invention, since an electric cable 2 is covered up by a substantially cylindrical magnetic structure 3 and a substantially cylindrical electrically conductive structure 4 and has a covered area which is twice as large as that in the above-described first preferred embodiment, it has been found that a radiant noise inhibiting effect is higher than that achieved by the radiant noise inhibiting assembly according to the above-described first preferred embodiment. More specifically, a radiant noise attenuation amount achieved by using the assembly of the second preferred embodiment is about 20 dB which is about 5 dB larger than that achieved using the assembly of the first preferred embodiment. However, it is also possible to adjust a radiant noise inhibiting effect by changing the length of both the substantially cylindrical magnetic structure 3 and the substantially cylindrical electrically conductive structure 4.

A radiant noise inhibiting assembly made according to a further preferred embodiment of the present invention will be described in detail below.

Figure 4:
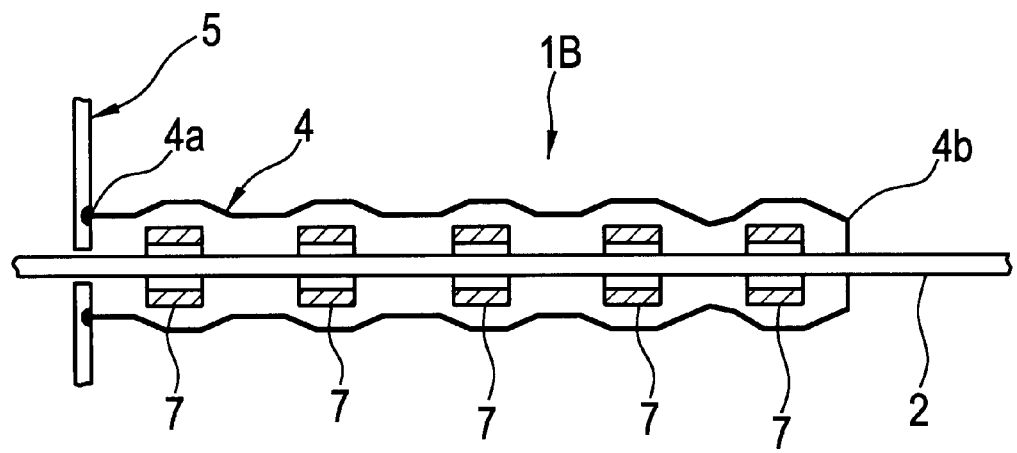
FIG. 4 is a schematically explanatory view illustrating an attachment of a radiant noise inhibiting assembly according to another preferred embodiment of the present invention.

FIG. 4 is an explanatory view illustrating an attachment of a radiant noise inhibiting assembly according to third preferred embodiment of the present invention. Referring to FIG. 4, the radiant noise inhibiting assembly of the third preferred embodiment is almost the same as the first preferred embodiment, except that the third preferred embodiment does not include a substantially cylindrical magnetic structure 3. Instead, the third preferred embodiment includes a plurality of ring-shaped core type magnetic members 7 each of which is constructed so as to allow insertion of the electric cable 2 therethrough. In practice, the plurality of ring-shaped members 7 are arranged to be mounted on the electric cable 2 with a predetermined interval in a manner as shown in FIG. 4. Similarly, to avoid repeated explanation, only the portions which are different from the first preferred embodiment will be described, and explanation of the similar portions is omitted.

However, if the radiant noise inhibiting assembly of third preferred embodiment is viewed as a whole, the ring-shaped core type magnetic members 7 are positioned on the innermost portion so as to partially cover the electric cable 2. In more detail, each of the core type magnetic members 7 used in the radiant noise inhibiting assembly of the third preferred embodiment is preferably a ferrite member having an inner diameter of about 10 mm, an outer diameter of about 14 mm, and a length of about 10 mm. In fact, there are preferably provided five ring-shaped core type magnetic members 7 with a predetermined interval of about 5 cm between adjacent members 7.

COMPARATIVE EXAMPLE 6

Comparative example 6 is almost the same as the third preferred embodiment 3 except that it does not include a substantially cylindrical electrically conductive structure 4.

Similar to the first preferred embodiment, when using the radiant noise inhibiting assembly 1B of the third preferred embodiment and the radiant noise inhibiting assembly of comparative example 6, the radiation levels of electromagnetic wave were measured and radiant noise attenuation amounts were also measured. As a result, it was discovered that when using the radiant noise inhibiting assembly 1B of the third preferred embodiment, a radiant noise could be inhibited by about 15 dB if it has a frequency of about 300 MHz or more.

In contrast, when using the radiant noise inhibiting assembly of comparative example 6, it was found that a radiant noise could only be inhibited by about 3 dB if it has a frequency of 300 MHz or more.

Figure 5:
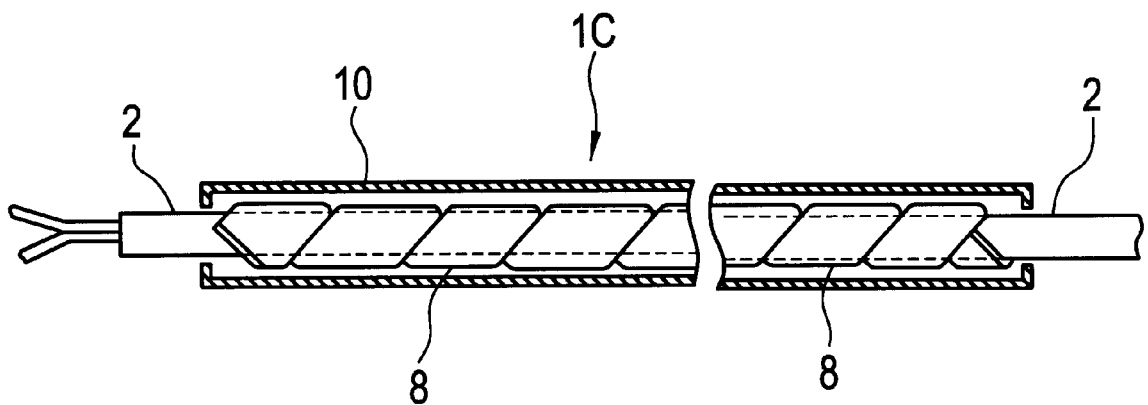
FIG. 5 is a schematically explanatory view illustrating the structure of a radiant noise inhibiting assembly according to a further preferred embodiment of the present invention.

A radiant noise inhibiting assembly according to a further preferred embodiment of the present invention will be described in detail below. FIG. 5 is a cross-sectional view illustrating a radiant noise inhibiting assembly 1C made according to a fourth preferred embodiment of the present invention. Referring to FIG. 5, the radiant noise inhibiting assembly does not include a substantially cylindrical magnetic structure 3, but includes an elongated flexible sheet-like magnetic material 8. Such elongated flexible sheet-like magnetic member 8 is arranged to wind spirally around an electric cable 2. Further, the electric cable 2, which is covered with the sheet-like magnetic material 8 being wound spirally thereon, is inserted into an electrically conductive, substantially cylindrical case 10 which is constructed to provide a function of an electrostatic shield, in a manner such that the portion of the electric cable 2 wound by the sheet-like magnetic material 8 is received entirely in the case 10.

Since other portions of the radiant noise inhibiting assembly of the fourth preferred embodiment are the same as those of the radiant noise inhibiting assembly of the first preferred embodiment, the explanation of these similar portions is omitted. Different portions will be described in further detail below.

The elongated sheet-like material 8 used in the fourth preferred embodiment is formed by the following process. More specifically, an amount of ferrite magnetic particles which may be used for a core-type magnetic member capable of providing a magnetic permeability of about 450 (measured frequency: 1 MHz), is comminuted so as to be formed into further smaller particles having an average diameter of about 15 $\mu$m. Then, about 85 weight percent of the magnetic particles is mixed and kneaded with a silicone rubber material, and a resulting mixture is then molded into a sheet-like material via extrusion. A finally obtained sheet-like material has a thickness of about 1 mm and a width of about 20 mm.

The electrically conductive, substantially cylindrical case 10 used in the fourth preferred embodiment is preferably made from a metal and may be a metal case which itself can function as an electrically conductive structure. Nevertheless, the substantially cylindrical case 10 may also be a synthetic resin case having a metal film disposed on a surface thereof for functioning as an electrically conductive layer. If the substantially cylindrical case 10 is a resin case coated with an electrically conductive metal layer, such metal layer may be formed via a chemical film formation process such as metal plating, a physical film formation process such as vacuum vapor deposition, or using a method of coating a surface of the resin case by applying an electrically conductive paste. In practice, the inner surface and/or the outer surface of the substantially cylindrical case 10 may be coated with an electrically conductive film by means of one of the above mentioned methods.

Figure 6:
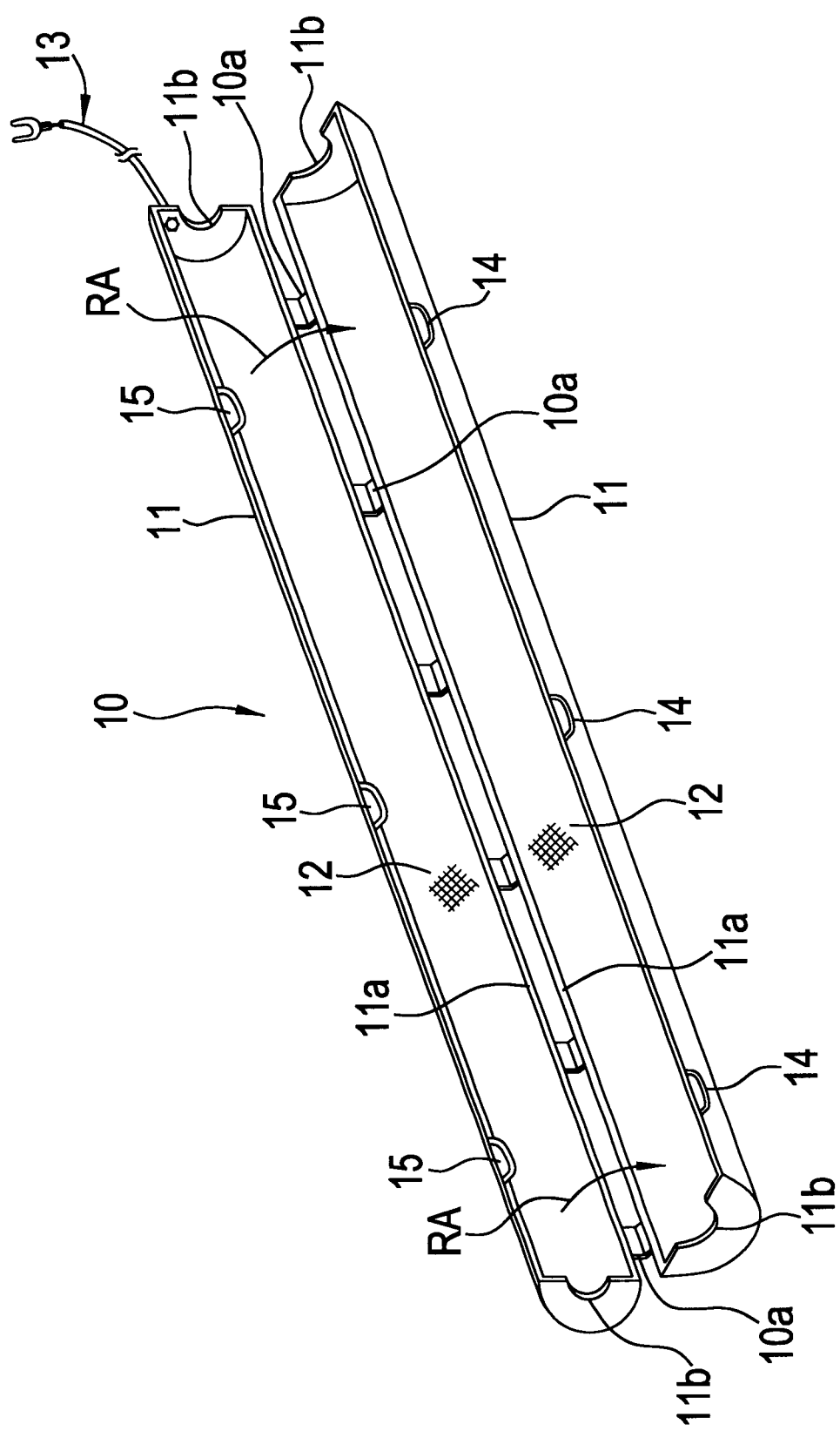
FIG. 6 is a perspective view schematically illustrating a substantially cylindrical case for use with radiant noise inhibiting assemblies according to preferred embodiments of the present invention.

Further, in the fourth preferred embodiment of the present invention, the substantially cylindrical case 10, as shown in FIG. 6, may include two half-cylindrical pieces 11, 11 which are combined together via a plurality, for example six, hinges 10a arranged in the longitudinal direction on one side of the two half-cylindrical pieces 11. Further, on each end surface of each half-cylindrical piece 11 there is formed a semi-circular notch 11b which allows an electric cable 2 to pass therethrough. Moreover, one end of either of the two half-cylindrical pieces 11 is connected to a ground wire 13 which functions as a conductor to be grounded. More specifically, such a ground wire 13 is connected with the metal film 12 on the surface of the one half-cylindrical piece 11.

When the two half-cylindrical pieces 11, 11 are to be assembled together, the electric cable 2 wound with the elongated sheet-like magnetic material 8 is at first accommodated into one of the two half-cylindrical pieces 11, then, the other half-cylindrical piece 11 is closed in a direction indicated by an arrow RA in FIG. 6. In this way, a plurality of retaining hooks 15 provided on one of the two half-cylindrical pieces 11 are fitted into a plurality of corresponding engaging holes 14 formed in the other half-cylindrical piece 11, thereby enabling the substantially cylindrical case 10 to be kept in a closed position. Finally, the ground wire 13 is connected to the ground of an electronic device such as a personal computer, thereby completing a predetermined attachment of the radiant noise inhibiting assembly 1C.

In practice, a wound part of the electric cable 2 wound by the elongated sheet-like material 8 preferably has a length of about 25 cm, while the substantially cylindrical case 10 has a length which is slightly longer than about 25 cm.

When using the radiant noise inhibiting assembly 1C according to the fourth preferred embodiment, a magnetic structure is allowed to be attached onto an electric cable very easily by simply winding the surface of the electric cable 2 with an elongated sheet-like magnetic material 8. Further, upon attaching the substantially cylindrical case 10 in a predetermined position, the provision of an electrically conductive structure which functions as an electrostatic shield can thus be completed. Further, since a ground connection can be accomplished with great ease simply by connecting a ground wire 13 in a manner shown in FIG. 6, it is possible to simplify the entire operation of fixing a radiant noise inhibiting assembly in position.

Further, since the substantially cylindrical case 10 may be made of a metal which can provide a desired rigidity, it is possible to eliminate a separate process of forming an electrically conductive structure, thereby simplifying the overall manufacturing process.

Nevertheless, as discussed above, the substantially cylindrical case 10 can be a resin case. If the substantially cylindrical case 10 is a resin case, it can be manufactured using a proper resin molding process with a low cost, and as a result, the final product has a light weight.

Further, in the fourth preferred embodiment, to avoid any interruption of a magnetic circuit, it is preferred to wind an elongated sheet-like material 8 onto an electric cable 2 without any interval between winding rounds. Moreover, even if an elongated sheet-like material 8 is wound onto an electric cable 2 with some gaps between winding rounds, it is still possible to obtain a desired effect of inhibiting a radiant noise of an electric cable.

In addition, although it has been described in the fourth preferred embodiment that an elongated sheet-like magnetic material 8 is wound on to an electric cable 2, the elongated sheet-like magnetic material 8 can also be attached on to the electric cable 2 in a manner such that the cable 2 is sandwiched within the magnetic material 8. Further, if metal wire-knitted layer or electrically conductive carbon fiber is disposed within the substantially cylindrical case 10, it is possible to obtain a structure having a function as an electrostatic shield. Such a modified structure can be considered to be a modified preferred embodiment of the fourth preferred embodiment.

A radiant noise inhibiting assembly according to a further preferred embodiment of the present invention will be described in detail below.

Figure 7:
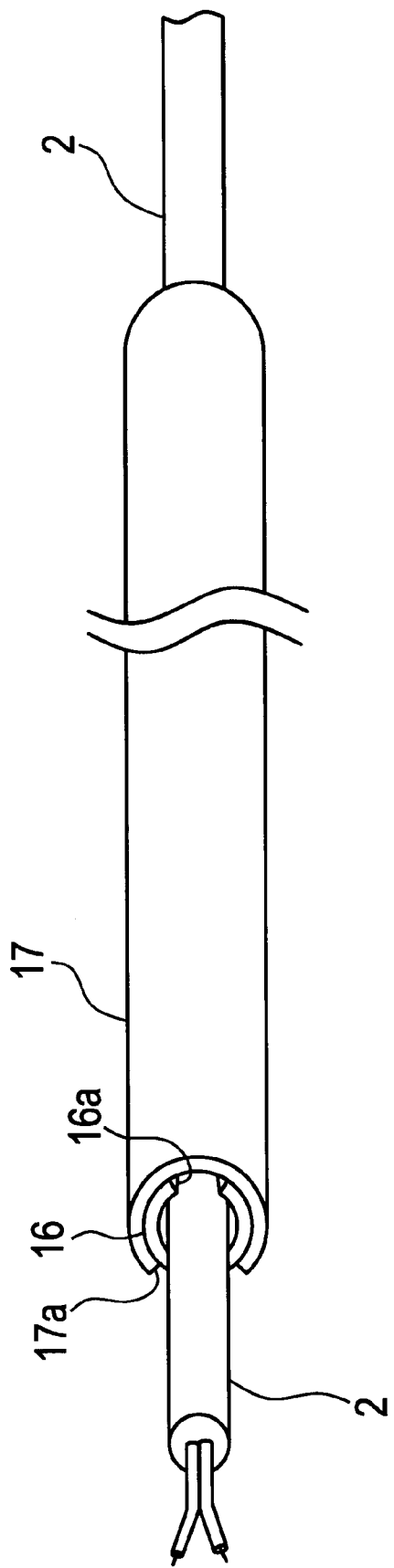
FIG. 7 is a perspective view schematically illustrating an attachment of a magnetic structure of a radiant noise inhibiting assembly according to a preferred of the present invention.

FIG. 7 is a perspective view illustrating a radiant noise inhibiting assembly 1C according to a fifth preferred embodiment of the present invention. Referring to FIG. 7, the radiant noise inhibiting assembly of the fifth preferred embodiment does not include an elongated sheet-like magnetic material 8 which is included in the fourth preferred embodiment. Instead, the assembly according to the fifth preferred embodiment includes two flexible, substantially cylindrical members 16 and 17 arranged to cover one another. More specifically, each of the flexible, substantially cylindrical members 16 and 17 is preferably made of a material obtained by mixing and kneading an amount of ferrite magnetic particles into a silicone rubber material and having a desired flexibility. Further, the flexible substantially cylindrical members 16 and 17 are each formed with a slot extending in the longitudinal direction thereof from a first end to a second end. Since other portions of the radiant noise inhibiting assembly of the fifth preferred embodiment are the same as those of the radiant noise inhibiting assembly of fourth preferred embodiment, the explanation of the similar portions is omitted. Different portions will be described in further detail below.

In the fifth preferred embodiment, a slot 16a is provided to extend along the longitudinal direction in the cylindrical member 16, a slot 17a is provided to extend in the longitudinal direction in the cylindrical member 17, with each of the slots 16a and 17a extending from a first end to a second end of the respective substantially cylindrical member. In particular, the slots 16a and 17a are formed such that portions of the substantially cylindrical members 16 and 17 having an angle of about 90 degrees in a vertical cross sectional direction thereof are cut out. More specifically, the substantially cylindrical member 16 is positioned on the outside of the electric cable 2 so as to cover the cable 2, the substantially cylindrical member 17 is positioned on the outside of the substantially cylindrical member 16 so as to cover main portions thereof including the slot 16a.

A process when the substantially cylindrical members 16 and 17 are to be attached in position to cover the electric cable 2, is described in detail below. At first, the electric cable 2 is fitted through the slot 16a into the inner portion of the substantially cylindrical member 16, then, the substantially cylindrical member 16 and the electric cable 2, are fitted together through the slot 17a into the inner side of the substantially cylindrical member 17. In this way, as shown in FIG. 7, it is possible to easily form a magnetic structure which functions as a magnetic shield. After that, a substantially cylindrical case shown in FIG. 6 is attached in position so as to cover up the assembly including the substantially cylindrical members 17 and 16 together with the electric cable 2 arranged in a manner shown in FIG. 7, thereby forming a desired radiant noise inhibiting assembly.

A radiant noise inhibiting assembly according to a further preferred embodiment of the present invention will be described in detail below.

Figure 8:
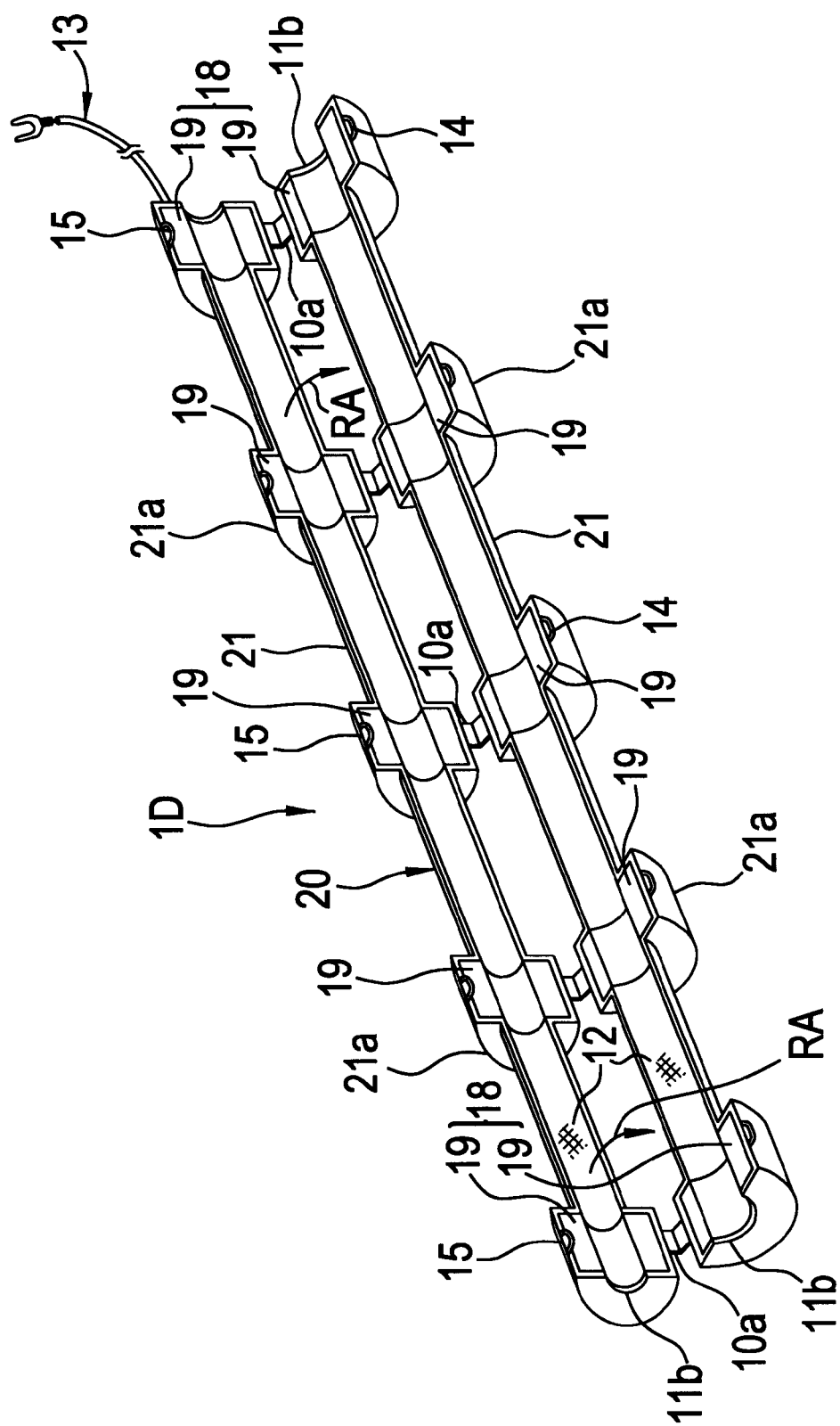
FIG. 8 is a perspective view schematically illustrating a radiant noise inhibiting assembly according to a preferred embodiment of the present invention.

FIG. 8 is a perspective view illustrating a radiant noise inhibiting assembly 1D according to a sixth preferred embodiment of the present invention. Referring to FIG. 8, the radiant noise inhibiting assembly of the sixth preferred embodiment does not include an elongated sheet-like magnetic material 8 as used in the fourth preferred embodiment 4, instead, it includes a plurality of two-piece type ring-like core members 18, with each ring-like member 18 including two half-ring core pieces 19, 19. A substantially cylindrical case 20 is constructed to receive in its inner side the two-piece ring-like core members 18. However, other portions of the radiant noise inhibiting assembly of the sixth preferred embodiment are the same as those of the radiant noise inhibiting assembly of the fourth preferred embodiment, so that the explanation of these same portions is omitted. Different portions will be described in further detail below.

In the radiant noise inhibiting assembly of the sixth preferred embodiment, the substantially cylindrical case 20 includes two half cylindrical pieces 21, 21, each of which includes recess portions 21a for housing half-ring core members 19. However, other portions of the substantially cylindrical case 20 are the same as those of the cylindrical case 10 of the fourth preferred embodiment.

When the radiant noise inhibiting assembly of the sixth preferred embodiment is to be attached in position, an electric cable 2 is fitted into one of the two half cylindrical pieces 21, 21, and arranged in the longitudinal direction of the half cylindrical piece 21. After that, the other half cylindrical piece 21 is closed in a direction shown by an arrow RA, thereby permitting an easy attachment of the radiant noise inhibiting assembly of the sixth preferred embodiment. Further, by closing together the two half cylindrical pieces 21, 21, each of the two half-ring core members 19,19 are brought together so as to form one ring-like core member 18, thereby forming a structure which functions as a magnetic shield.

In one example of this preferred embodiment, each ring-like core member 18 has an inner diameter of about 10 mm, an outer diameter of about 14 mm, a length of about 10 mm. An interval between every two ring-like core members 18 is about 5 cm.

Figure 9:
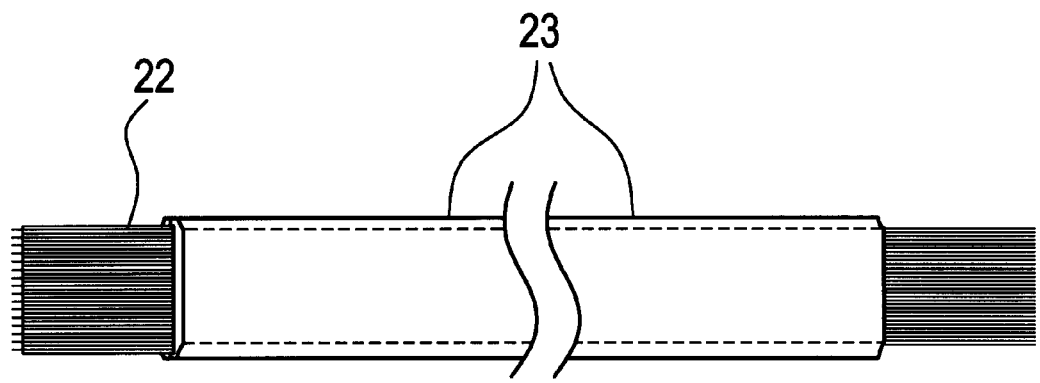
FIG. 9 is a plane view schematically illustrating an attachment of a magnetic structure of a radiant noise inhibiting assembly according to a preferred embodiment of the present invention.
Figure 10:
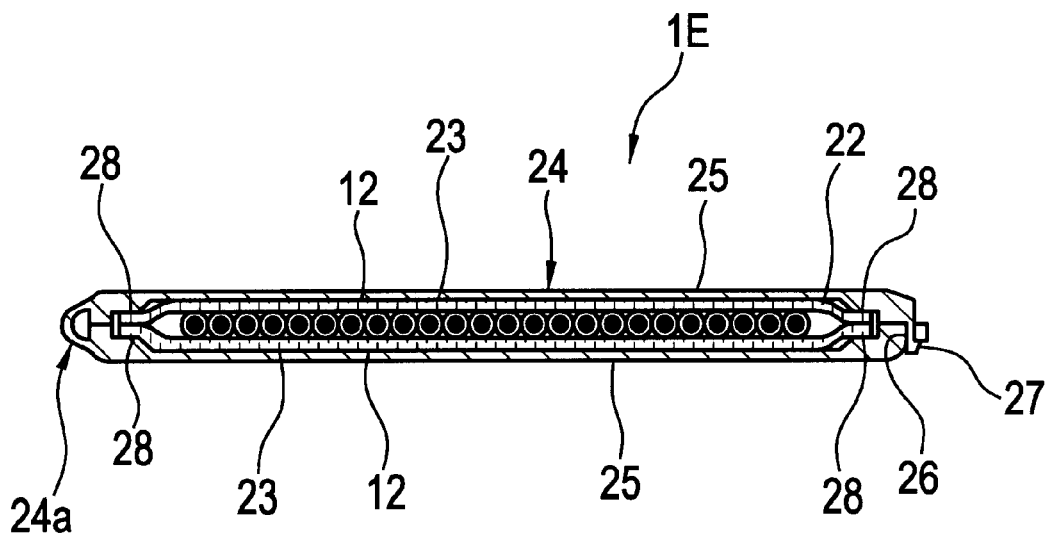
FIG. 10 is a cross-sectional view schematically illustrating an attachment of a radiant noise inhibiting assembly according to a preferred embodiment of the present invention.
Figure 11:
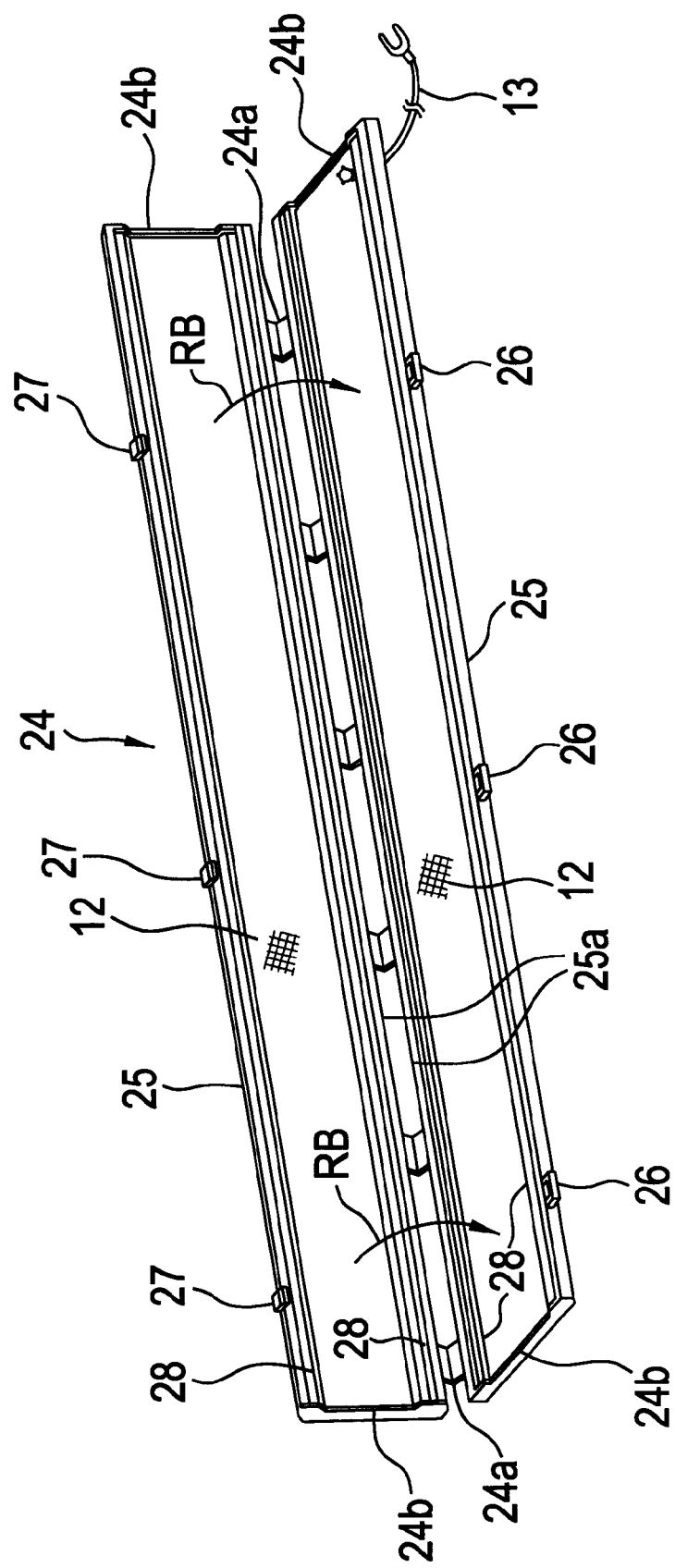
FIG. 11 is a perspective view schematically illustrating a flat case of a radiant noise inhibiting assembly according to preferred embodiment of the present invention.
Figure 12:
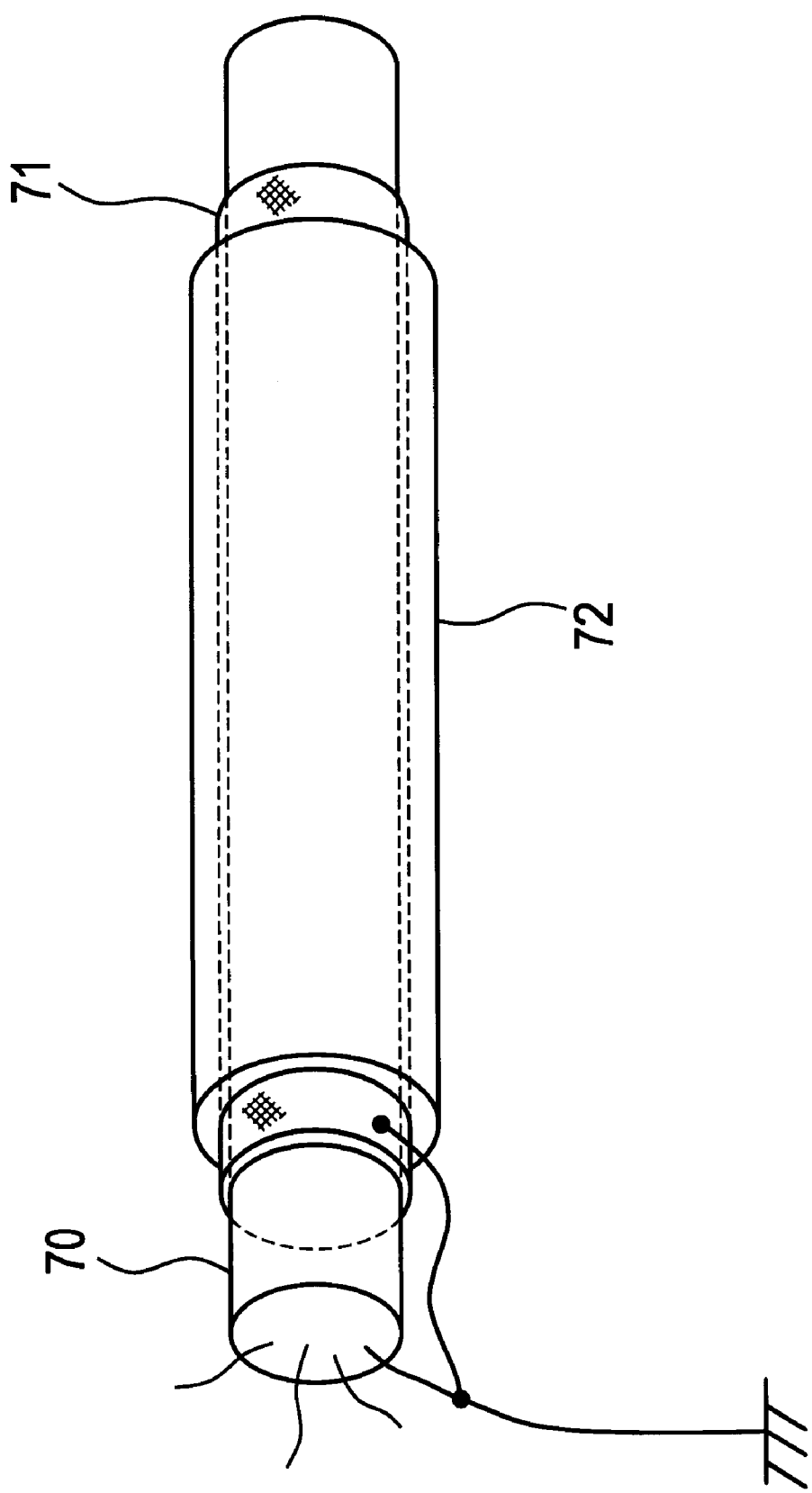
FIG. 12 is a perspective view schematically illustrating a radiant noise inhibiting assembly according to a prior art device.

A radiant noise inhibiting assembly according to a seventh preferred embodiment of the present invention will be described in the following with reference to FIGS. 9 and 10. As shown in FIGS. 9 and 10, a radiant noise inhibiting assembly 1E of the seventh preferred embodiment is used to inhibit a radiant noise from a flat cable 22 (an electric cable) which includes a plurality of electric wires each covered by an insulating material layer. Two sheet-like magnetic material layers 23 are provided on both surfaces of the flat cable 22. In addition, as shown in FIG. 11, the radiant noise inhibiting assembly of the seventh preferred embodiment further includes an elongated flat case 24 constructed to function as an electrostatic shield. However, since other portions of the radiant noise inhibiting assembly of the seventh preferred embodiment are the same as those of the radiant noise inhibiting assembly of the fourth preferred embodiment, the explanation of the common portions is omitted. Different portions will be described in further detail below.

The elongated sheet-like magnetic material layers 23 used in the seventh preferred embodiment are formed according to the following process. An amount of ferrite magnetic particles which may be used for a core-type magnetic member capable of providing a magnetic permeability of about 450 (measurement frequency: 1 MHz), is comminuted so as to be formed into further smaller particles having an average diameter of about 15 µm. Then, about 85 weight percent of the magnetic particles are mixed and kneaded with a silicone rubber material, and a resulting mixture is then molded into a sheet-like layer via extrusion. A finally obtained sheet-like layer has a thickness of about 1 mm and a width of about 30 mm.

The elongated flat case 24 for functioning as an electrostatic shield includes two case pieces 25, 25 each formed with an elongated recess portion on one side thereof. The two case pieces 25, 25 are combined together via hinges 24a provided along respective one side 25a of the respective case piece 25 in the longitudinal direction thereof. In this way, the two case pieces 25, 25 are closed together or opened apart, with the use of the hinges 24a.

In particular, along two inner sides of each case piece 25 there are formed two elongated stepped portions 28, 28 which will cause the elongated sheet-like magnetic material 23 to be press-fitted therebetween in the longitudinal direction thereof, so as to form a closed magnetic circuit.

Further, each end of each case piece 25 includes a slit-like notch 24b which is used for passing therethrough an electric cable.

In practice, the flat case 24 may be made of a metal. Alternatively, the flat case 24 can be made of a resin coated on its surface with a metal film for use as an electrically conductive layer. Anyway, there is no specific restriction to the structure of the flat case 24 so long as the flat case 24 is provided with an electric conductivity.

A process of attaching the radiant noise inhibiting assembly in a predetermined manner will be described in detail below. At first, as shown in FIG. 9, an elongated sheet-like magnetic material 23 is arranged to cover the flat cable 22 (electric cable) on both surfaces thereof. Then, the elongated sheet-like magnetic material 23 together with the flat cable 22 is fitted into one of the two flat case pieces 25, 25 of the flat case 24. After that, the other of the two flat case pieces 25, 25 is closed in a direction indicated by an arrow RB in FIG. 11. Subsequently, retaining hooks 27 provided on one flat case piece 25 are caused to engage into corresponding holes 26 provided on the other flat case piece 25, thereby keeping the flat case 24 in a firmly closed position.

Finally, a ground wire 13 is connected to the ground side of an electric device, thereby completing the attachment of the radiant noise inhibiting assembly.

Further, with the radiant noise inhibiting assembly 1E of the present preferred embodiment, as shown in FIG. 11, since there are two elongated stepped portions 28, 28 along two inner sides of each flat case piece 25, when the two flat case pieces 25, 25 are closed together, the two longitudinal edge portions of the elongated sheet-like magnetic material 23 will be firmly press-fitted by the two elongated stepped portions 28, 28, thereby exactly forming a closed magnetic circuit on the elongated sheet-like magnetic material 23. Therefore, it is possible to ensure an exact function as a magnetic shield which is provided by the elongated sheet-like magnetic material 23.

Although it has been described in the above several preferred embodiments that the elongated sheet-like magnetic material capable of producing a function as a magnetic shield may have a length of about 25 cm or about 50 cm, it is also possible that the elongated sheet-like magnetic material may have a length greater than about 50 cm.

Further, although it has been described in the above several preferred embodiments that a substantially cylindrical case is constructed to be freely opened and closed, such a substantially cylindrical case may also be constructed so that it can not be opened or closed.

The present invention, even with respect to other points, features, elements and structural details thereof should not be limited to the above described preferred embodiments. In fact, so long as a modification is within a scope of a gist of the present invention, it is possible to perform any kind of modification with respect to the material and the shape of a magnetic structure, the material and the shape of an electrically conductive structure, the type of an electric cable, the connection state of a ground wire, and the type of a digital electronic device.

Some effects of the present invention will be explained in detail below.

A radiant noise inhibiting assembly of preferred embodiments of the present invention allows an electric cable connected to a digital type electronic device to be covered by a magnetic structure which is constructed to provide a magnetic shield. Disposed on the outside of the magnetic structure is an electrically conductive structure which is constructed to function as an electrostatic shield. Therefore, it is possible to ensure two kinds of functions, a magnetic shield and an electrostatic shield, thereby sufficiently inhibiting a radiant noise in the electric cable.

Further, with the use of a radiant noise inhibiting assembly of preferred embodiments of the present invention, only a first end of the electrically conductive structure is connected to a ground of the electronic device, the first end being closer to the electronic device than the a second end of the electrically conductive structure. The second end of the electrically conductive structure is not grounded. Therefore, it is possible to reliably prevent a radiant noise from transmitting through an electrically conductive structure to an electronic device connected to a front end of the electric cable.

Moreover, with the use of a radiant noise inhibiting assembly of preferred embodiments of the present invention, if the magnetic structure has a substantially annular shape, the magnetic structure can be positioned on the outside of an electric cable so as to cover the electric cable, thereby permitting an easy attachment of the magnetic structure in a predetermined position with respect to the electric cable.

Further, with the use of a radiant noise inhibiting assembly of preferred embodiments of the present invention, if the magnetic structure has a sheet-like shape, an electric cable may be easily covered by the sheet-like magnetic structure, thereby permitting an easy arrangement of the magnetic structure around the electric cable.

Moreover, in a radiant noise inhibiting assembly of preferred embodiments of the present invention, the assembly has a substantially cylindrical case which is constructed so that the electric cable covered by the magnetic structure may pass through the internal space of the substantially cylindrical case, the electrically conductive structure is disposed in the substantially cylindrical case, in a manner such that the magnetic structure is completely covered by the electrically conductive structure. Therefore, attaching the substantially cylindrical case will be equivalent to attaching an electrically conductive structure, thus permitting an easy attachment of the radiant noise inhibiting assembly.

Further, in the radiant noise inhibiting assembly according to preferred embodiments of the present invention, the magnetic structure to be received into the substantially cylindrical case can be a sheet-like magnetic material having a predetermined flexibility. The magnetic structure is adapted to cover up the outer surface of the electric cable by being wound around the outer surface of the electric cable, or alternatively, by being formed as a two-layer structure so that the electric cable is sandwiched between the two layers of the two-layer magnetic structure. In this way, a magnetic structure is easily wound around the surface of the electric cable, thereby permitting an easy attachment of the magnetic structure, simply by wrapping the electric cable with a magnetic material.

Moreover, in the radiant noise inhibiting assembly of preferred embodiments of the present invention, the magnetic structure may include two substantially cylindrical flexible members each having an elongated slot extending from a first end to a second end in the longitudinal direction thereof, a first of the two substantially cylindrical members is positioned on the outside of the electric cable so as to cover the electric cable, a second of the two substantially cylindrical members is positioned on the outside of the first substantially cylindrical member so as to cover main portions thereof including its elongated slot with the electric cable in the innermost position. Therefore, it is possible to ensure an easy attachment of magnetic structure in a predetermined position, simply by introducing the electric cable into the substantially cylindrical flexible members.

Further, in the radiant noise inhibiting assembly of preferred embodiments of the present invention, the magnetic structure includes a plurality of ring-like core members each of which is a two-piece type ring-like core member including two half-ring core pieces. The cylindrical case is a two-piece type, substantially cylindrical case including two elongated half cylindrical pieces divided in the longitudinal direction thereof. The half-ring core pieces are arranged on the two elongated half cylindrical pieces in a manner such that when the two elongated half cylindrical pieces are closed together to form the cylindrical case, every pair of corresponding half-ring core pieces defines one ring-like core member. Therefore, it is possible to ensure an easy attachment of every component of the radiant noise inhibiting assembly, simply by attaching the substantially cylindrical case in position.

Moreover, in the radiant noise inhibiting assembly of preferred embodiments of the present invention, the electric cable is a flat cable. The magnetic structure is a two-layer sheet-like magnetic structure having a predetermined flexibility, and is positioned on both sides of the flat cable in a manner such that the flat cable is sandwiched between two layers of the two-layer sheet-like magnetic structure. The substantially cylindrical case includes two half case pieces divided in the longitudinal direction thereof. When the two half case pieces are closed together, two longitudinal edge portions of the two-layer sheet-like magnetic structure covering the flat cable are firmly pressed by the two half case pieces of the substantially cylindrical case, thereby forming a closed magnetic circuit around the flat cable. In this way, preferred embodiments of the present invention are also suitable for inhibiting a radiant noise of a flat electric cable. In addition, since a closed magnetic circuit is formed in the magnetic structure, it is possible to reliably and precisely provide a function as a magnetic shield by virtue of the magnetic structure.

Further, in the radiant noise inhibiting assembly of preferred embodiments of the present invention, the flexible magnetic structure is made of a magnetic rubber obtained by mixing and kneading an amount of magnetic particles into a rubber. Therefore, it is possible to obtain a magnetic structure having a predetermined flexibility, thus rendering preferred embodiments of the present invention to be more practically useful.

Moreover, in the radiant noise inhibiting assembly of preferred embodiments of the present invention, the substantially cylindrical case is preferably made of a metal so that the substantially cylindrical case itself can serve as an electrically conductive structure. In this way, it is possible not only to improve the strength of the substantially cylindrical case, but also to eliminate a specific, separate process for forming the electrically conductive structure.

Alternatively, in the radiant noise inhibiting assembly of preferred embodiments of the present invention, the substantially cylindrical case may be made of a resin and a metal film disposed on the surface of such resin case so as to obtain an electrical conductivity for the substantially cylindrical case. Therefore, it is possible to manufacture the substantially cylindrical case so as to have a light weight, using a resin which may be easily formed into a desired shape with very low cost.

While preferred embodiments of the present invention have been disclosed, various modes of carrying out the principles disclosed herein are contemplated as being within the scope of the following claims. Therefore, it is understood that the scope of the present invention is not limited except as otherwise set forth in the claims.

What is claimed is:

1. A radiant noise inhibiting assembly, comprising:
    a magnetic structure arranged along a portion of a length of an electric cable connected to a digital electronic device, said magnetic structure being arranged to cover substantially an entire circumference of the portion of the length of the electric cable, and in direct contact with said electric cable;
    an electrically conductive structure arranged to cover the magnetic structure substantially along the portion of the length of the electric cable and extending over a length that is less than the total length of the electric cable, the electrically conductive structure being electrically insulated from said electric cable;
    wherein a first end of the electrically conductive structure is connected to a ground of the electronic device, a second end of said electrically conductive structure is not connected to a ground, said first end being closer to said electronic device than said second end of the electrically conductive structure.

2. The radiant noise inhibiting assembly according to claim 1, wherein said magnetic structure is arranged to continuously or intermittently cover substantially the entire circumference of the electric cable substantially along the portion of the length of the electric cable.

3. The radiant noise inhibiting assembly according to claim 1, wherein the electrically conductive structure is arranged to continuously cover the magnetic structure substantially along the portion of the length of the electric cable.

4. The radiant noise inhibiting assembly according to claim 1, wherein the second end of the electrically conductive structure is not connected to the ground of the electronic device.

5. The radiant noise inhibiting assembly according to claim 1, wherein the magnetic structure has a substantially annular shape.

6. The radiant noise inhibiting assembly according to claim 1, wherein the magnetic structure has a substantially sheet-like shape.

7. The radiant noise inhibiting assembly according to claim 1, further comprising a substantially cylindrical case arranged such that the electric cable covered by the magnetic structure passes through an internal portion of the substantially cylindrical case, the electrically conductive structure is disposed in the substantially cylindrical case such that the magnetic structure is covered by the electrically conductive structure.

8. The radiant noise inhibiting assembly according to claim 7, wherein said magnetic structure disposed in the inner portion of the substantially cylindrical case is a sheet-like magnetic material having a predetermined flexibility.

9. The radiant noise inhibiting assembly according to claim 8, wherein said magnetic structure is adapted to cover an outer surface of the electric cable by being wound around the outer surface of the electric cable.

10. The radiant noise inhibiting assembly according to claim 8, wherein said magnetic structure includes a two-layer structure having two layers, and said magnetic structure is adapted to cover an outer surface of the electric cable so that the electric cable is sandwiched between the two layers of the two-layer magnetic structure.

11. The radiant noise inhibiting assembly according to claim 1, wherein the magnetic structure includes two substantially cylindrical flexible members each having an elongated slot extending from a first end to a second end along a longitudinal direction thereof, a first of the two substantially cylindrical members is disposed on an outer surface of the electric cable so as to cover the electric cable, a second of the two substantially cylindrical members is disposed on an outer surface of the first substantially cylindrical member so as to cover main portions thereof including the elongated slot of the first substantially cylindrical member.

12. The radiant noise inhibiting assembly according to claim 1, wherein the magnetic structure includes a plurality of substantially ring-shaped core members each of which includes two half-ring core pieces.

13. The radiant noise inhibiting assembly according to claim 12, further comprising a two-piece substantially cylindrical case having two elongated half-cylindrical pieces divided along a longitudinal direction thereof; wherein
the half-ring core pieces are arranged on the two elongated half-cylindrical pieces such that when the two elongated half cylindrical pieces are closed together to define the substantially cylindrical case, each of pairs of the corresponding half-ring core pieces define one of the ring-shaped core members.

14. The radiant noise inhibiting assembly according to claim 1, wherein the electric cable is a flat cable.

15. A radiant noise inhibiting assembly according to claim 14, wherein the magnetic structure includes a two-layer sheet magnetic structure having a predetermined flexibility, and is positioned on both sides of the flat cable such that the flat cable is sandwiched between the two-layers of the two-layer sheet-like magnetic structure.

16. The radiant noise inhibiting assembly according to claim 15, further including a flat case having two half case pieces divided along a longitudinal direction thereof, such that when the two half case pieces are closed together, two longitudinal edge portions of the two-layer sheet magnetic structure covering the flat cable are pressed by the two half case pieces of the flat case, thereby defining a closed magnetic circuit around the flat cable.

17. The radiant noise inhibiting assembly according to claim 1, wherein the magnetic structure is made of a magnetic rubber including magnetic particles mixed and kneaded into a rubber.

18. A radiant noise inhibiting assembly according to claim 1, further comprising a substantially cylindrical case made of a metal and constructed such that the substantially cylindrical case defines said electrically conductive structure.

19. A radiant noise inhibiting assembly according to claim 1, further comprising a substantially cylindrical case made of a resin.

20. A radiant noise inhibiting assembly according to claim 19, further comprising a metal film disposed on a surface of said resin case so as to define an electrical conductivity for the substantially cylindrical case.

* * * * *